(12) United States Patent
Kahmen

(10) Patent No.: US 9,362,934 B2
(45) Date of Patent: Jun. 7, 2016

(54) OPTICALLY CLOCKED DIGITAL/ANALOG CONVERTER AND A DDS UNIT WITH SUCH A CONVERTER

(71) Applicant: Rohde & Schwarz GmbH & Co. KG, Munich (DE)

(72) Inventor: Gerhard Kahmen, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 14/397,630

(22) PCT Filed: Apr. 24, 2013

(86) PCT No.: PCT/EP2013/058511
§ 371 (c)(1),
(2) Date: Oct. 28, 2014

(87) PCT Pub. No.: WO2013/164232
PCT Pub. Date: Nov. 7, 2013

(65) Prior Publication Data
US 2015/0123713 A1 May 7, 2015

(30) Foreign Application Priority Data

Apr. 30, 2012 (DE) .......... 10 2012 207 163
Jul. 26, 2012 (DE) .......... 10 2012 213 172

(51) Int. Cl.
*H03M 1/66* (2006.01)
*H03M 1/08* (2006.01)
(Continued)

(52) U.S. Cl.
CPC ............... *H03M 1/0836* (2013.01); *G02F 7/00* (2013.01); *H03M 1/66* (2013.01); *H03M 1/70* (2013.01); *H03M 1/72* (2013.01); *H03M 1/745* (2013.01)

(58) Field of Classification Search
CPC ....... H03M 1/66; H03M 1/72; H03M 1/0836; H03M 1/70; H03M 1/745; G02F 7/00
USPC ......................................... 341/137, 144, 145
See application file for complete search history.

(56) References Cited

U.S. PATENT DOCUMENTS 6,202,165 B1 * 3/2001 Pine .................... G06F 1/105
713/500
7,015,724 B2 * 3/2006 Godin ...................... H03F 3/08
326/133

(Continued)

FOREIGN PATENT DOCUMENTS

JP        H0927974 A      1/1997
WO   2013/164232 A1    11/2013

OTHER PUBLICATIONS

Notification of Transmittal of Translation of the International Preliminary Report on Patentability; International Preliminary Report on Patentability; Written Opinion of the International Searching Authority for corresponding International Application No. PCT/EP2013/058511, dated Nov. 13, 2014, 11 pages.

(Continued)

*Primary Examiner* — Brian Young
(74) *Attorney, Agent, or Firm* — Ditthavong & Steiner, P.C.

(57) ABSTRACT

A digital/analog converter (30) with a first return-to-zero unit ($31_1$) which is connected to a first busbar ($32_1$), wherein the first busbar ($32_1$) is connected in each case to a first output of several differential units ($35_1$, $35_2$, $35_n$). In this context, the first return-to-zero unit ($31_1$) provides at least one clock input which is directly or indirectly connected to a first photodiode, wherein the first photodiode is fed from a pulsed light source (5).

15 Claims, 5 Drawing Sheets

(51) Int. Cl.
*H03M 1/72* (2006.01)
*G02F 7/00* (2006.01)
*H03M 1/70* (2006.01)
*H03M 1/74* (2006.01)

(56) References Cited

U.S. PATENT DOCUMENTS

| | | | |
|---|---|---|---|
| 7,042,379 B2 * | 5/2006 | Choe | H03M 1/0881 |
| | | | 341/144 |
| 7,576,675 B1 | 8/2009 | Lee et al. | |
| 7,646,984 B1 * | 1/2010 | Ho | G06F 1/105 |
| | | | 398/154 |
| 2006/0135108 A1 | 6/2006 | De Ranter et al. | |
| 2008/0080809 A1 | 4/2008 | Kushiyama et al. | |
| 2011/0043399 A1 | 2/2011 | Baek et al. | |

OTHER PUBLICATIONS

Bugeja et al.,"A 14-b, 100-MS/s CMOS DAC Designed for Spectral Performance", IEEE Journal of Solid-State Circuits, vol. 34, No. 12, Dec. 1, 1999, pp. 1719-1732.

International Search Report corresponding to PCT/EP2013/058511 dated Jul. 3, 2013, 3 pages.

* cited by examiner

OPTICALLY CLOCKED DIGITAL/ANALOG CONVERTER AND A DDS UNIT WITH SUCH A CONVERTER

CROSS-REFERENCE TO RELATED APPLICATION

The present application is a national phase application of PCT Application No. PCT/EP2013/058511, filed Apr. 24, 2013, and claims priority to German Application No. DE 10 2012 207 163.6, filed on Apr. 30, 2012, and German Application No. DE 10 2012 213 172.8, filed on Jul. 26, 2012, the entire contents of which are herein incorporated by reference.

BACKGROUND OF THE INVENTION

1. Field of the Invention

The invention, according to the various embodiments described herein, relates to a digital/analog converter which provides a very high dynamic range and a unit for direct digital synthesis (DDS) with such a digital/analog converter.

2. Discussion of the Background

In communications systems, it is necessary to generate broadband signals with a high dynamic range. For this purpose, high-speed digital/analog converters are generally fitted with a return-to-zero unit (return-to-zero (RTZ)) which minimises the effects of settling processes on the output signal. In order to create a digital/analog converter which provides a good signal-to-noise respectively distortion ratio (signal-to-noise and distortion ratio (SNDR)), a slight phase noise in these return-to-zero units is necessary. For optimal operation in this context, the lowest possible residual jitter, in the order of magnitude of, for example, a few femtoseconds, should be aimed for, which can be achieved only with narrow-band oscillators of extremely high quality and is associated with high costs.

The disadvantage is that the digital/analog converter uses a complex clock distribution including time deskewing (deskewing). Numerous intermediate amplifiers and phase shifters are used in these clock distribution systems to distribute the clock pulse and achieve the required driver capability. In this context, technologically determined fluctuations in delay time must be compensated. Each of these components adds additional jitter, which impairs the accuracy of the time system, that is, of the digital/analog converter, especially with high sampling rates.

SUMMARY OF THE INVENTION

A digital/analog converter and a corresponding unit for direct digital synthesis which provide a very low phase noise, and allows for a high dynamic range even in high-speed applications is herein provided. A digital/analog converter by the features of claim 1 and with regard to the unit for direct digital synthesis by the features of claim 14 is created. Advantageous further developments are specified in the respective dependent claims.

According to an exemplary embodiment, a digital/analog converter provides a first return-to-zero unit which is connected to a first busbar, wherein the first busbar is connected in each case to a first output of several differential units. In another embodiment, the first return-to-zero unit provides at least one clock input which is connected to a first photodiode, wherein the first photodiode is fed from a pulsed light source.

It is particularly advantageous that the final unit in the high-speed digital/analog converter, the so-called return-to-zero unit, receives a clock signal which is generated by a photodiode which converts a pulsed light signal into an electrical clock signal, because pulsed light signals which provide a jitter reduced by 1 to 2 orders of magnitude by comparison with the best solutions realised purely electronically can be generated. As a result of the fact that the final unit, that is, the return-to-zero unit, receives a clock signal from a pulsed light source, any jitter present in the data signals supplied can be effectively suppressed. The supplied data signal is consequently synchronised to the high-precision optical clock.

According to another embodiment, further advantage is achieved with the digital/analog converter if a second return-to-zero unit is present which is connected to a second busbar, wherein the second busbar is connected in each case to a second output of the several differential units, and wherein the second return-to-zero unit provides at least one clock input which is connected to the first photodiode. In this context, it is particularly advantageous that the digital/analog converter, according to one embodiment, allows a differential operation and, in view of the fact that both return-to-zero units receive the same clock signal, that they are synchronised with one another.

According to another embodiment, further advantage is achieved with the digital/analog converter if each of the several differential units provides at least one data input, wherein each data input is connected to a data output of one optically clocked flip-flop and/or if each of the optically clocked flip-flops provides a data input which is connected to a digital logic module. The use of an optically clocked flip-flop means that the phase noise, that is, the jitter, on a data signal which is supplied to a differential unit, is effectively suppressed, respectively that the phase noise is determined only by the jitter of the high-precision optical clock. It is particularly advantageous that such an optically clocked flip-flop also provides a very good jitter performance. Phase noise which arises through a complex clock distribution and clock delay within the digital logic module can be effectively suppressed by means of an optically clocked flip-flop for every data input.

Additionally, an advantage is achieved with the digital/analog converter if the clock input of every optically clocked flip-flop is fed from the pulsed light source, so that the phase noise at the data input is reduced to the phase noise of the pulsed light source (5). As already explained, a pulsed light source has an excellent jitter performance, so that the phase noise can be removed from the digital data signal at the output of the digital logic module.

In one embodiment, an advantage is achieved with the digital/analog converter if the several differential units feed the first busbar via their first output and the second busbar via their second output, and/or if the digital/analog converter is embodied in such a manner that its first and/or its second return-to-zero unit connects the current on the first and/or second busbar through to a first and/or second output as soon as the settling process of the current on the first and/or second busbar is concluded and/or has fallen below a specified threshold value. In this context, it is particularly advantageous that the digital/analog converter is embodied in such a manner that the current on the first busbar or second busbar is connected through to the outside only as soon as the settling process has concluded and the current ripple has fallen below a threshold value. This is achieved in that the clock signal for the several differential units or the first and/or second return-to-zero unit is delayed, for example, via delay elements, in such a manner that the first and/or second return-to-zero unit connects the first and/or second busbar to the output of the digital/analog converter only when the switching process of the several differential units has already been concluded. This ensures that the current ripple on the first busbar and/or second busbar is not transmitted to the output.

Additionally, in one embodiment, an advantage is achieved with the digital/analog converter if its components, such as at least a part of the optical waveguide, by means of which the first photodiode and/or the further photodiode and/or the clock-pulse generator and/or the optically clocked flip-flops are fed with the pulsed light signal, are integrated together in a semiconductor chip, especially in a ASICs (application-specific integrated circuit). This means that the first photodiode and/or the further photodiode and/or the optically clocked flip-flops can be attached as close as possible to the modules to be switched, thereby further reducing the phase noise. Furthermore, such a monolithic integration lowers the manufacturing costs and reduces the complexity of manufacture.

Furthermore, an advantage is achieved if the pulsed light source is a mode-locked laser (mode-locked laser), because mode-locked lasers can generate periodic light pulses in the ps-range with repetition rates in the GHz range and provide a considerably reduced phase noise by comparison with conventional oscillators.

Finally, it is particularly advantageous if a unit for direct digital synthesis (direct digital synthesis (DDS)) provides such a digital/analog converter, according to an embodiment, wherein the unit for direct digital synthesis further comprises a phase register and a look-up table, wherein an output of the phase register is fed back to the addition unit at the input of the phase register, and wherein the output of the phase register is connected to the look-up table, and wherein the look-up table is connected to the digital/analog converter. Such a unit for direct digital synthesis provides a significantly higher dynamic range if the digital/analog converter according to an embodiment is used, so that the latter is suitable for use in precision circuits.

BRIEF DESCRIPTION OF THE DRAWINGS

Various exemplary embodiments of the invention are described by way of example in the following with reference to the drawings. Identical subject matters provide the same reference numbers. In detail, the corresponding figures in the drawings show:

FIG. 1 shows an overview circuit diagram of an optically clocked flip-flop 1 together with a further digital logic module 2 on a semiconductor chip 3, especially in an ASIC 3 (application-specific integrated circuit). As already explained, the quality of the clock signal significantly determines the quality of timed systems. For example, the quality of the clock signal acts indirectly on the size of the "eye opening" of digital signals and accordingly on the transmission security, respectively on the speed in the case of the digital signal transmission. The larger the eye opening is, the faster the data rate which can be transmitted synchronously can be selected to be. To improve the quality of the output signal of the digital circuit, for example, a final post-synchronisation flip-flop is used. For the case that the data word supplied to the post-synchronisation flip-flop is also affected with a phase noise, the eye opening of the digital output signal is increased to correspond with the low-jitter clock pulse. For this reason, an optically clocked flip-flop 1 is used as the post-synchronisation flip-flop in FIG. 1.

Furthermore, FIG. 1 shows a pulsed light source 5 which is formed, for example, by a mode-locked laser 5. The mode-locked laser 5 generates an optical clock signal with an extremely low jitter which, in the exemplary embodiment, leads to a significant improvement in the phase noise of the output signal. In this context, the optical clock signal which the mode-locked laser 5 generates is supplied to the optically clocked flip-flop 1.

Figure 1:
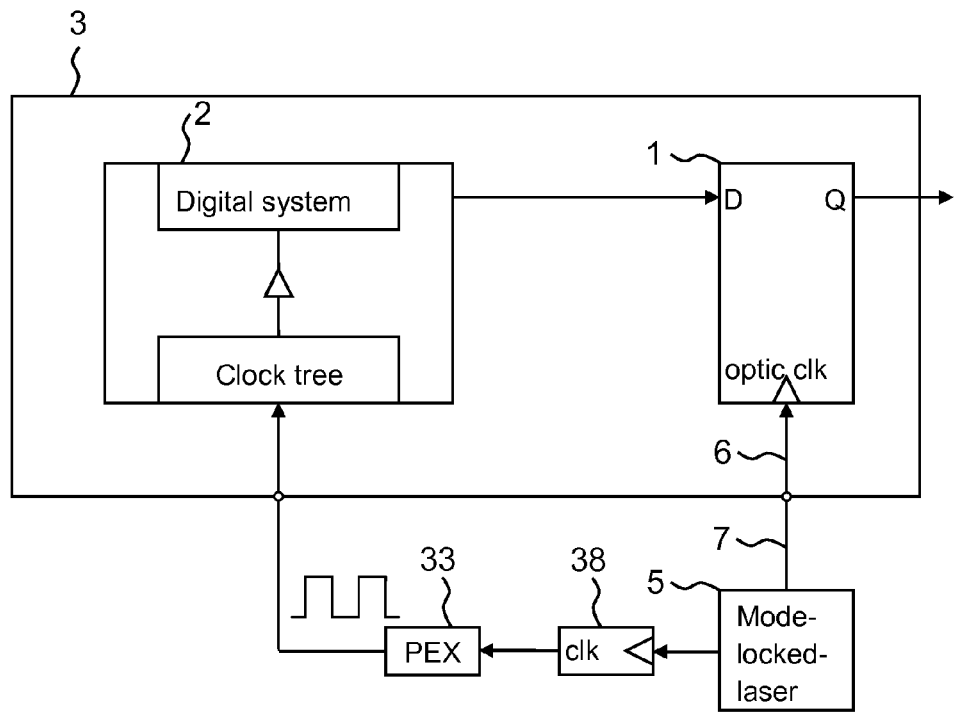
FIG. 1 an overview circuit diagram of an optically clocked flip-flop for synchronisation together with a further digital circuit component, according to one embodiment.

The digital logic module 2 is operated with a clock pulse which is generated by the mode-locked laser 5. In this context, the optical clock signal is converted by a photodiode 20 into an electrical clock signal. Accordingly, the photodiode 20 is preferably embodied in a high-precision clock-pulse generator 38, which can also be an optically clocked flip-flop 1, as will be explained later. The formulation "high-precision" is attributable to the fact that the phase noise of the clock-pulse generator 38 is as high as, and only minimally higher than, the phase noise of the mode-locked laser 5. The output of the high-precision clock-pulse generator 38 can be connected to a pulse extender 33 which ensures that the electrical clock signal at the output of the high-precision clock-pulse generator 38 provides a duty cycle (duty cycle) of preferably 50%. The electrical clock signal at the output of the pulse extender 33 is supplied to the logic module 2. This clock signal is then distributed to the individual systems in the digital logic module 2 via a clock tree. In this context, additional delay elements and amplifiers can be used. This, and the fact that the digital logic module 2 should have the smallest possible power uptake, which once again leads to a low slew-rate of the individual elements in the digital logic module, means an increased phase noise and a relatively poorer synchronisation. However, this phase noise can be suppressed with the use of the optically clocked flip-flop 1 as a post-synchronisation flip-flop at the output of the digital circuit module 2. It is particularly advantageous here that the digital logic module 2 and the optically clocked flip-flop 1 are integrated together on a semiconductor chip 3, especially an ASIC 3. As will be explained in the following, the optically clocked flip-flop 1 also contains at least one photodiode 20 which converts a pulsed light signal into an electrical clock signal and accordingly drives the transistors in the optically clocked flip-flop 1. In this context, it is particularly advantageous that this photodiode is also integrated directly in the ASICs 3.

Additionally, in the case of the illustrated exemplary embodiment, at least a part of the optical waveguide 6, which guides the pulsed light signal, is also directly integrated in the ASIC 3. This can be realised, for example, by forming the optical waveguide 6 in the ASIC from a medium which is transparent in this wavelength range, for example, germanium or $SiO_2$, which is formed on the wafer. The other digital logic modules 2 can be formed, for example, using SiGe technology or CMOS technology (complementary metal oxide semiconductor) on another part of the same ASICs. The mode-locked laser 5 can accordingly be connected to the optical waveguide 6 by means of a light-wave conductor 7, for example, a glass fibre.

Accordingly, the optical clock signal emitted by the mode-locked laser 5 is guided directly to the circuit modules, wherein the conversion of the optical clock signal into a low-jitter electrical clock signal is implemented by broadband integrated photo-detectors, that is, by photodiodes. These photodiodes are placed directly, that is to say, as close as possible, on the critical circuit modules to be clocked. Accordingly, a further electrical clock tree which would impair the jitter properties of the clock signal can be dispensed with.

As a result of the improvement in the phase noise, the quality of the digital transmission can be increased, thereby raising the attainable data rate, respectively reducing the bit-error rate.

Figure 2A:
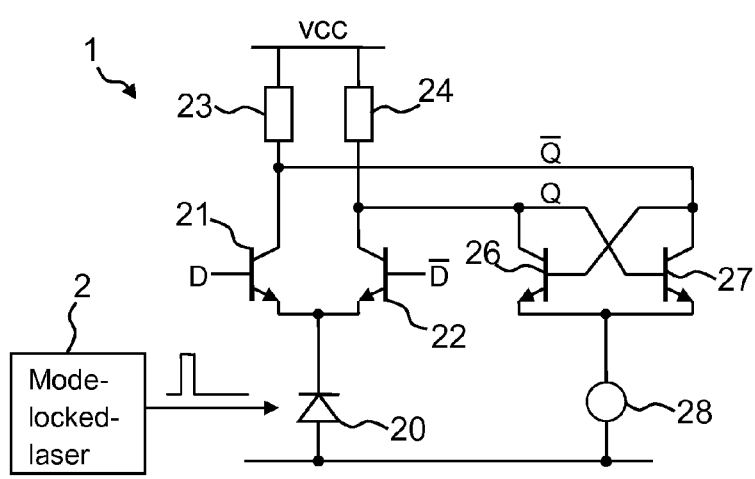
FIG. 2A an exemplary construction of an optically clocked flip-flop.

FIG. 2A shows an exemplary construction of an optically clocked flip-flop 1. The input $\overline{D}$ and the output $\overline{Q}$ are not shown in FIG. 1 for reasons of visual clarity.

The optically clocked flip-flop 1 provides four bipolar transistors 21, 22, 26 and 27. In this context, the emitters of the transistors 21, 22 are connected to the photodiode 20, which, for its part, is connected to a negative supply voltage which can also be connected to ground. The data inputs D and $\overline{D}$ are connected to the base terminals of the transistors 21, 22. The data signal is present at the latter. The collectors of the transistors 21, 22 are each connected by means of a resistor 23, 24 to a positive supply voltage.

The photodiode 20 is connected in this circuit in such a manner that, so long as no light strikes the photodiode 20, only a minimal leakage current flows. As soon as light strikes the photodiode 20, a photo-current from an n-doped to a p-doped region of the photodiode 20 arises. The intensity of the photo-current is proportional in a good approximation to the light output of the laser pulse. The differential pair of transistors 21, 22 is supplied with the data signal.

A latch is formed by a differential pair of transistors 26, 27. The base terminals of this differential pair are connected in a crossing manner to the collector terminals of the transistors 21, 22. That is, the base terminal of the transistor 26 is connected to the collector terminal of the transistor 21. The base terminal of the transistor 27 is connected to the collector terminal of the transistor 22. Beyond this, the collector terminal of the transistor 26 is connected to the collector terminal of the transistor 22. The collector terminal of the transistor 27 is also connected to the collector terminal of the transistor 21. The emitter terminals of the transistors 26, 27 are connected via a current source 28 to a negative supply voltage, which can also be connected to ground. As a result of the crossing configuration, a positive feedback is generated and accordingly the logical status of the latch is maintained. In this context, the resting current of the latch generated from the current source 28 must be significantly lower than the photo-current which is generated by the photodiode 20. Only if this condition is fulfilled can the photo current of the photodiode 20 exceed the resting current of the current source 28 and thus change the logical status of the latch.

The optically clocked D-flip-flop 1 shown here can be used for a plurality of applications. In particular, it is suitable for an application in a high-precision clock-pulse generator 38.

Figure 2B:
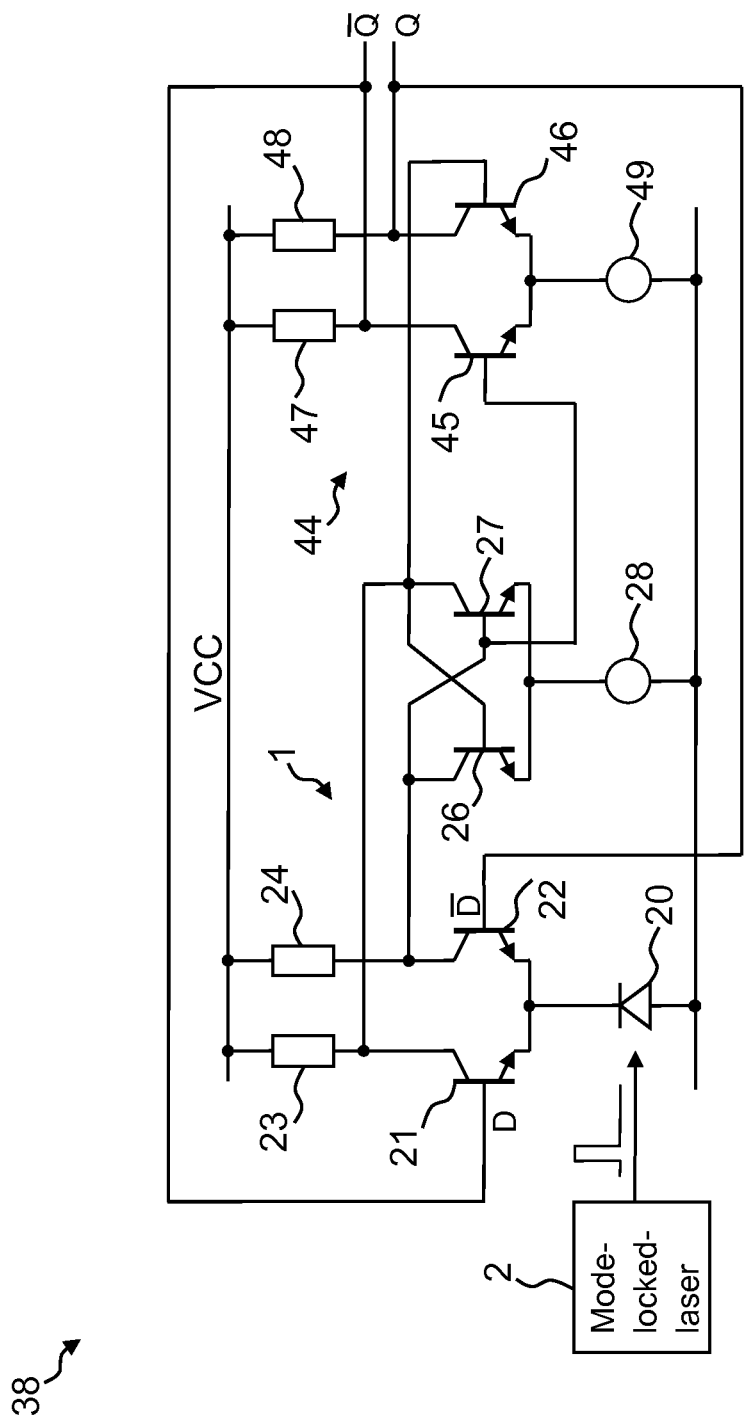
FIG. 2B an exemplary construction of an optical clock-pulse generator which provides the optically clocked flip-flop.

FIG. 2B shows an exemplary construction of such a high-precision clock-pulse generator 38 which comprises the optically clocked flip-flop 1 and a feedback unit 44.

This feedback unit 44 can comprise a first transistor 45 and a second transistor 46, a current source 49 and two resistors 47, 48. The first resistor 47 of the feedback unit 44 is connected between a positive supply voltage and the collector of the first transistor 45 of the feedback unit 44 as a load resistor. The second resistor 48 of the feedback unit 44 is connected between a positive supply voltage and the collector of the second transistor 46 of the feedback unit 44 as a load resistor. The emitters of the first and second transistor 45, 46 of the feedback unit 44 are each connected to the current source 49, which is connected to a negative supply voltage which can also be connected to ground. The base of the first transistor 45 of the feedback unit 44 is connected to the base of the transistor 27. The base of the second transistor 46 of the feedback unit 44 is connected to the base of the transistor 26. Beyond this, the collector of the first transistor 45 of the feedback unit 44 is connected to the base of the transistor 21 as a feedback. Similarly, the collector of the second transistor 46 of the feedback unit 44 is connected to the base of the transistor 22.

In this case, the signal $\overline{Q}$ is not present at the collector of the first transistor 45 of the feedback unit 44, whereas the signal Q is present at the collector of the second transistor 46 of the feedback unit 44. The signal $\overline{Q}$ is fed back to the data input D, whereas the signal Q is fed back to the data input $\overline{D}$. Accordingly, a clock signal is formed, of which the clock states each occupy 50% of the clock pulse. The frequency of this clock signal corresponds to half the pulse frequency of the mode-locked laser 5. The pulse extender 33 (T-flip-flop) is therefore directly integrated in the in the high-precision clock-pulse generator 38 and will be described separately in the figures of the drawings only for the sake of clarity.

Figure 3A:
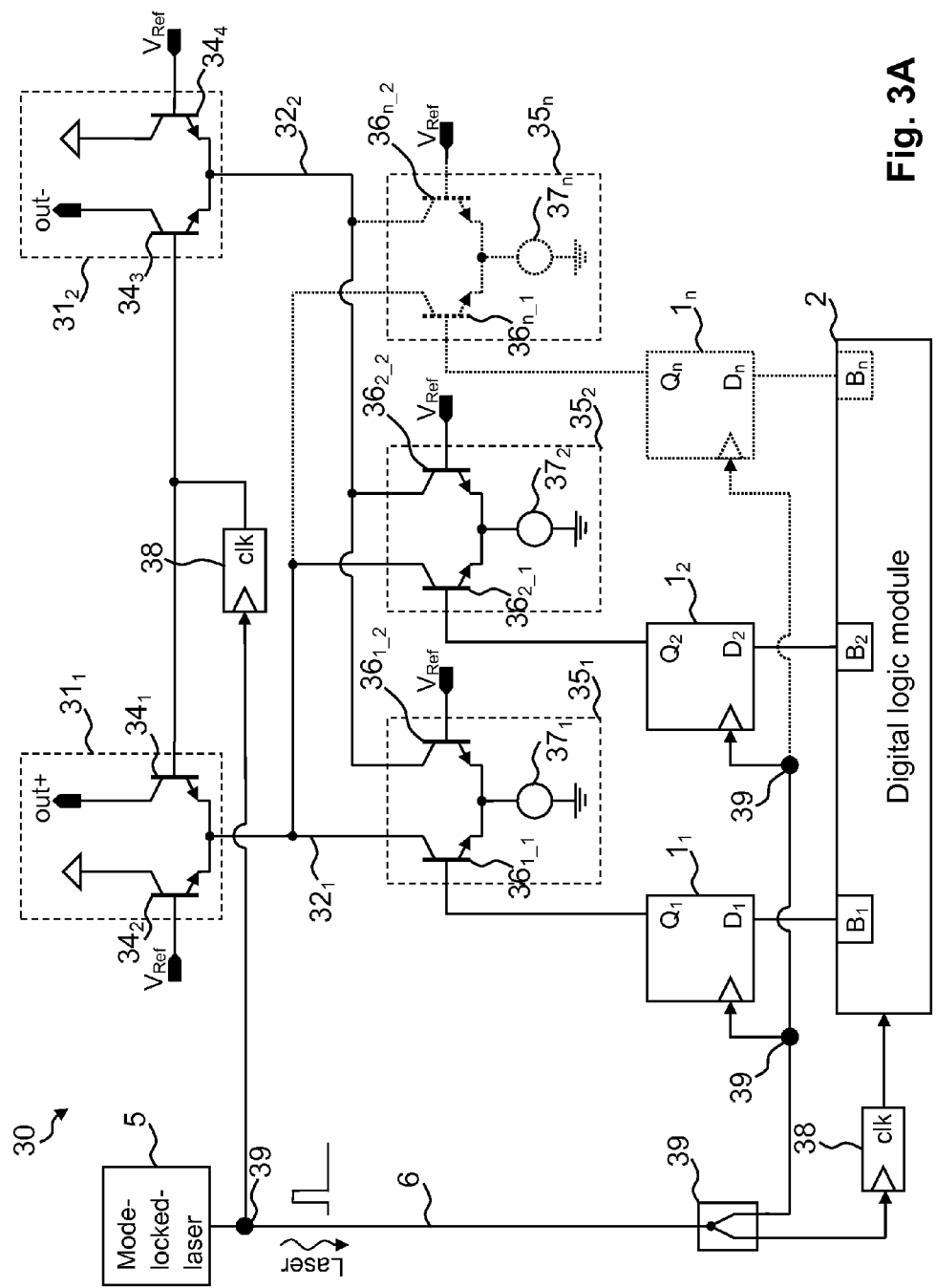
FIG. 3A an exemplary construction of a digital/analog converter with a particularly high dynamic range which is achieved in an optical manner through the optical clocking of the return-to-zero unit.

FIG. 3A shows an exemplary construction of a digital/analog converter 30 according to one embodiment—with a particularly high dynamic range which is achieved through the optical clocking of the return-to-zero unit $31_1$, $31_2$. A first return-to-zero unit $31_1$ and a second return-to-zero unit $31_2$ are clearly visible. These two units $31_1$ and $31_2$ are an extremely sensitive component of a high-speed digital/analog converter 30 with regard to the jitter of the system clock. The jitter on the clock signal with which the two units $31_1$, $31_2$ are controlled therefore acts directly on the signal quality in the form of a restriction of the dynamic range.

It is also clearly evident that the first return-to-zero unit $31_1$ is connected to a first busbar $32_1$. At the other side, the second return-to-zero unit $31_2$ is connected to a second busbar $32_2$.

Furthermore, the first return-to-zero unit $31_1$ provides a clock input which is connected directly or indirectly to a first photodiode 20, wherein the first photodiode 20 is fed by a mode-locked laser 5. The same also applies for the second return-to-zero unit $31_2$, which also provides a clock input, which is directly or indirectly connected to the first photodiode 20. In the case of a direct connection, the electrical clock signal generated by the first photodiode 20 is supplied directly to the first and/or second return-to-zero unit $31_1$, $31_2$. In the case of an indirect connection, the clock input of the first and/or second return-to-zero unit $31_1$, $31_2$ is connected to the high-precision clock-pulse generator 38 or to the optically clocked flip-flop 1, $1_1$, $1_2$ to $1_n$, which was described in FIG. 2, wherein the high-precision clock-pulse generator 38, respectively the optically clocked flip-flop 1, $1_1$, $1_2$ to $1_n$ contains the first photodiode 20. The electrical output signal of this first photodiode 20 is supplied within the high-precision clock-pulse generator 38 to the transistors 21 and 22, as described in FIG. 2. It is also possible that a pulse extender 33 is further connected between the first photodiode 20 and/or the high-precision clock-pulse generator 38 and the clock inputs of the first and/or second return-to-zero unit $31_1$, $31_2$. This pulse extender 33 ensures that the switching pulse is broadened. With a pulse extender 33, a duty cycle (duty cycle) can be adjusted arbitrarily. With the use of a high-precision clock-pulse generator 38 from FIG. 2, such a pulse extender 33 is already integrated. A duty cycle of 50% is achieved constantly here. A duty cycle of 50% should also preferably be set. The generation of other duty cycles, especially those smaller than 50%, can optionally have a positive influence on the phase noise of the electrical clock signal.

The first return-to-zero unit $31_1$ comprises at least one first transistor $34_1$ and a second transistor $34_2$, wherein the emitter outputs of the two transistors $34_1$, $34_2$ are connected to one another and to the first busbar $32_1$. In this context, a base terminal of the first transistor $34_1$ is connected directly or indirectly to a first photodiode 20. A constant voltage is preferably present at the base terminal of the second transistor $34_2$ in the exemplary embodiment according to an embodiment shown in FIG. 3A.

The same also applies for the second return-to-zero unit $31_2$, which also comprises at least one first transistor $34_3$ and a second transistor $34_4$. The emitter outputs of the first transistor $34_3$ and the second transistor $34_4$ within the second return-to-zero unit $31_2$ are connected at one end to one another and at the other end to the second busbar $32_2$. Furthermore, a base terminal of the first transistor $34_3$ is directly or indirectly connected to the first photodiode 20, whereas a constant voltage is present at a base terminal of the second transistor $34_4$.

A collector terminal of the first transistor $34_1$ of the first return-to-zero unit $31_1$ is connected to a first signal output of the digital/analog converter 30 according to an exemplary embodiment. A collector terminal of the first transistor $34_3$ of the second return-to-zero unit $31_2$ is connected to a second signal output of the digital/analog converter 30 according to an exemplary embodiment.

A collector terminal of the second transistor $34_2$ of the first return-to-zero unit $31_1$ is connected to a load resistor, which is not illustrated, in such a manner that a signal at the collector terminal of the second transistor $34_2$ completely drains into the latter.

The same also applies for the collector terminal of the second transistor $34_4$ of the second return-to-zero unit $31_2$, which is also terminated as ideally as possible.

The voltage, which is connected at the base terminal of the second transistor $34_2$ of the first return-to-zero unit $31_1$, must be selected in such a manner that it is lower than the pulse height of the clock signal (High-Level) and, at the same time, however, higher than the pulse height of the switched-off clock signal (Low-Level). The same also applies for the voltage which is applied at the base terminal of the second transistor $34_4$ of the second return-to-zero unit $31_2$. This voltage must also be smaller than the pulse height of the clock signal (High-Level) and be higher than the pulse height of the switched-off clock signal (Low-Level).

For the case that the logic level of the clock signal is "high", the first return-to-zero unit $31_1$ outputs the current on the first busbar $32_1$ via the collector output of the first transistor $34_1$ to the first signal output of the digital/analog converter 30. At the same time, the second return-to-zero unit $31_2$ outputs the current on the second busbar $32_2$ at the collector terminal of the first transistor $34_3$ to the second signal output of the digital/analog converter 30.

For the case that the logic level of the clock signal is "low", the reverse applies in that the current on the first busbar $32_1$ drains via the second transistor $34_2$ into the load resistor connected there. The same also applies for the current on the second busbar $32_2$, which drains via the second transistor $34_4$ of the second return-to-zero unit $31_2$ to the connected load resistor. Furthermore, the digital/analog converter 30 according to an exemplary embodiment also provides several differential units $35_1$, $35_2$ to $35_n$, where n≥0 and n ϵ. In this context, the several differential units $35_1$, $35_2$ to $35_n$ provide a first output which is connected to the first busbar $32_1$, and a second output which is connected to the second busbar $32_2$.

Each of these several differential units $35_1$, $35_2$ to $35_n$ provides a data input, wherein each data input is connected to the data output in each case of an optically clocked flip-flop $1_1$, $1_2$ to $1_n$. Each of these optically clocked flip-flops $1_1$, $1_2$ to $1_n$ can be constructed as specified in the optically clocked flip-flop 1 from FIG. 2.

Each of the optically clocked flip-flops $1_1$, $1_2$ to $1_n$ provides a data input which is connected to the digital logic module 2.

Each optically clocked flip-flop $1_1$, $1_2$ to $1_n$ provides at its clock input a photodiode 20, wherein the photodiode 20 converts a pulsed light signal, especially a pulsed light signal generated by a laser, into an electrical clock signal and supplies it to the transistors 21, 22, 26 and 27 within the optically clocked flip-flop $1_1$, $1_2$ to $1_n$. As already described, the clock input of every optically clocked flip-flop $1_2$, $1_2$ to $1_n$ is fed from the mode-locked laser 5, thereby suppressing the phase noise at the data input of every optically clocked flip-flop $1_2$, $1_2$ to $1_n$.

The digital logic module 2 is also directly or indirectly connected to a photodiode 20, which converts a pulsed light signal from the mode-locked laser 5 into an electrical clock signal and supplies it to the transistors within the digital logic module 2. By preference, the high-precision clock-pulse generator 38 described in FIG. 2, which generates an electrical clock signal from a pulsed light signal and provides it to the transistors within the digital logic module 2, is also used. In this case, the digital logic module 2 is connected indirectly to the photodiode 20. It is also possible for a pulse extender 33 which varies the duty cycle to be further connected downstream of the high-precision clock-pulse generator 38 or downstream of the photodiode 20. Here, however, the electrical clock signal at the output of the high-precision clock-pulse generator 38 already has a duty cycle of 50%.

The digital logic module 2 provides a data output for every differential unit $35_2$, $35_2$ to $35_n$. It is evident that the digital logic module 2 contains a clock tree and a plurality of delay units, which all add additional jitter to the clock signal, so that the digital output signals at the individual outputs of the digital logic module 2 are not synchronous with one another. However, the phase displacement of the digital output signals at the data outputs of the digital logic module 2 may be only so large relative to one another that a synchronisation by the optically clocked flip-flops $1_2$, $1_2$ to $1_n$ is still possible. In particular, the output signals at the data outputs must be synchronous with one another, preferably, for example, less than one half period of the clock signal.

Furthermore, each of the several differential units $35_1$, $35_2$ to $35_n$ provides a first transistor $36_{1\_1}$, $36_{2\_1}$, $36_{n\_1}$ and a second transistor $36_{1\_2}$, $36_{2\_2}$, $36_{n\_2}$. In this context, the emitter of the first transistor $36_{1\_1}$, $36_{2\_1}$, $36_{n\_1}$ and the emitter of the second transistor $36_{1\_2}$, $36_{2\_2}$, $36_{n\_2}$ are connected to one another and in each case to a current source $37_1$, $37_2$ to $37_n$. Furthermore, a collector terminal of the first transistor $36_{1\_1}, 36_{2\_1}, 36_{n\_1}$ of each of the several differential units $35_1$, $35_2$ to $35_n$ is connected to the first busbar $32_1$. Moreover, a collector terminal of the second transistor $36_{1\_2}, 36_{2\_2}, 36_{n\_2}$ of each of the several differential units $35_1$, $35_2$ to $35_n$ is connected to the second busbar $32_2$.

The base terminal of the first transistor $36_{1\_1}$ of the first differential unit $35_1$ is connected to an output of the first optically clocked flip-flop $1_1$. The same applies for the further differential units $35_2$ to $35_n$. The base terminal of the first transistor $36_{2\_1}$ of the second differential unit $35_2$ is connected to the output of the second optically clocked flip-flop $1_2$, whereas the first transistor $36_{n\_1}$ is connected to the output of the optically clocked flip-flop $1_n$.

The base terminals of the second transistors $36_{1\_2}, 36_{2\_2}, 36_{n\_2}$ in the exemplary embodiment from FIG. 3A are connected to a constant voltage source. The voltage must be selected in such a manner that it is lower than the logic level "high" at the output of the optically clocked flip-flop $1_1$, $1_2$ to $1_n$ and, at the same time, higher than the logic level "low" at the output of the optically clocked flip-flop $1_1$, $1_2$ to $1_n$.

For the case that, for example, the logic levels at the output of all optically clocked flip-flops $1_1$, $1_2$ to $1_n$ are "high", all current sources $37_1$, $37_2$ to $37_n$ are connected to the first busbar $32_1$, so that their currents are added. For the case that the logic levels of all optically clocked flip-flops $1_1$, $1_2$ to $1_n$ are "low", all current sources $37_2$, $37_2$ to $37_n$ are connected to the second busbar $32_2$, so that the currents are added there. For the case that the logic levels of the optically clocked flip-flops $1_1$, $1_2$ to $1_n$ are different, the currents of some current sources $37_2$, $37_2$ to $37_n$ are added on the first busbar $32_1$ and the currents of other current sources $37_1$, $37_2$ to $37_n$ are added on the second busbar $32_2$.

An 8-bit digital/analog converter 30 can adjust 256 output states. By preference, such an 8-bit digital/analog converter 30 provides 256 differential units $35_1$ to $35_{256}$. The current sources $37_1$ to $37_{256}$ in each case output the same current. However, it is also possible for an 8-bit digital/analog converter 38 to provide only 8 differential units $35_1$ to $35_8$, wherein the current sources $37_1$ to $37_8$ must then be weighted accordingly.

The optically clocked flip-flops $1_1$, $1_2$ to $1_n$ must all operate synchronously with one another, that is, they must receive the same clock signal at the same time. This ensures that the differential units $35_1$, $35_2$ to $35_n$ connect the current sources $37_1$, $37_2$ to $37_n$ either to the first busbar $32_1$ and/or to the second busbar $32_2$ at the same time. Furthermore, it must be ensured that the first return-to-zero unit $31_1$ and the second return-to-zero unit $31_2$ then connect the current signal on the first busbar $32_1$ and on the second busbar $32_2$ through to their signal output, as soon as the settling process which was caused by the switching process in the differential units $35_1$, $35_2$ to $35_n$ is completed. In this case, the current signal on the first busbar $32_1$ and the current signal on the second busbar $32_2$, which still provides an overshoot, drains in the corresponding load resistor of the first return-to-zero unit $31_1$ and the second return-to-zero unit.

As soon as the settling process of the current on the first and/or second busbar $31_1$, $31_2$ is concluded, or the current ripple has fallen below a specified threshold value, the first return-to-zero unit $31_1$ connects the first busbar $32_1$ to the first signal output of the digital/analog converter 30 according to an exemplary embodiment. At the same time, the second return-to-zero unit $31_2$ connects the second busbar $32_2$ to the second signal output of the digital/analog converter 30 according to an exemplary embodiment. In the planning of the digital/analog converter 30, the current ripple of the settling process can be simulated, so that a time can be calculated at which the current ripple is smaller than a specified threshold value, wherein the specified threshold value is obtained from the accuracy of the digital/analog converter 30 according to an exemplary embodiment and can be adjusted arbitrarily. Via delaying elements within the optical clock tree or the electrical clock tree, the switching time of the first return-to-zero unit $31_1$ and the second return-to-zero unit $31_2$ can be adjusted accordingly with reference to the differential units $35_1$, $35_2$ to $35_n$. Such delay elements can be achieved, for example, with a meandering course of the optical waveguide 6.

Furthermore, it is preferable that the first return-to-zero unit $31_1$, the second return-to-zero unit $31_2$, the several differential units $35_1$, $35_2$ to $35_n$, in each case with an optically clocked flip-flop $1_1$, $1_2$ to $i_n$, the digital logic module 2 and the first photodiode 20 and any further photodiodes, respectively the optical clock-pulse generator, are integrated in a monolithic manner on the semiconductor chip 3. In particular, the optical waveguide 6 by means of which the pulsed light signal for the clock generation is transmitted is also integrated on this semiconductor chip 3. The semiconductor chip 3 is especially an ASIC.

The pulsed light signal can be distributed within the semiconductor chip 3 to different waveguides through an optical power splitter 39. In this context, the output of each branch is adjusted within the each optical power splitter 39 in such a manner that a pulsed light signal is present in every photodiode 20 at the end of every waveguide, which provides the identical or an approximately identical power. Accordingly, relatively longer waveguides require a relatively stronger pulsed light signal at the beginning.

Figure 3B:
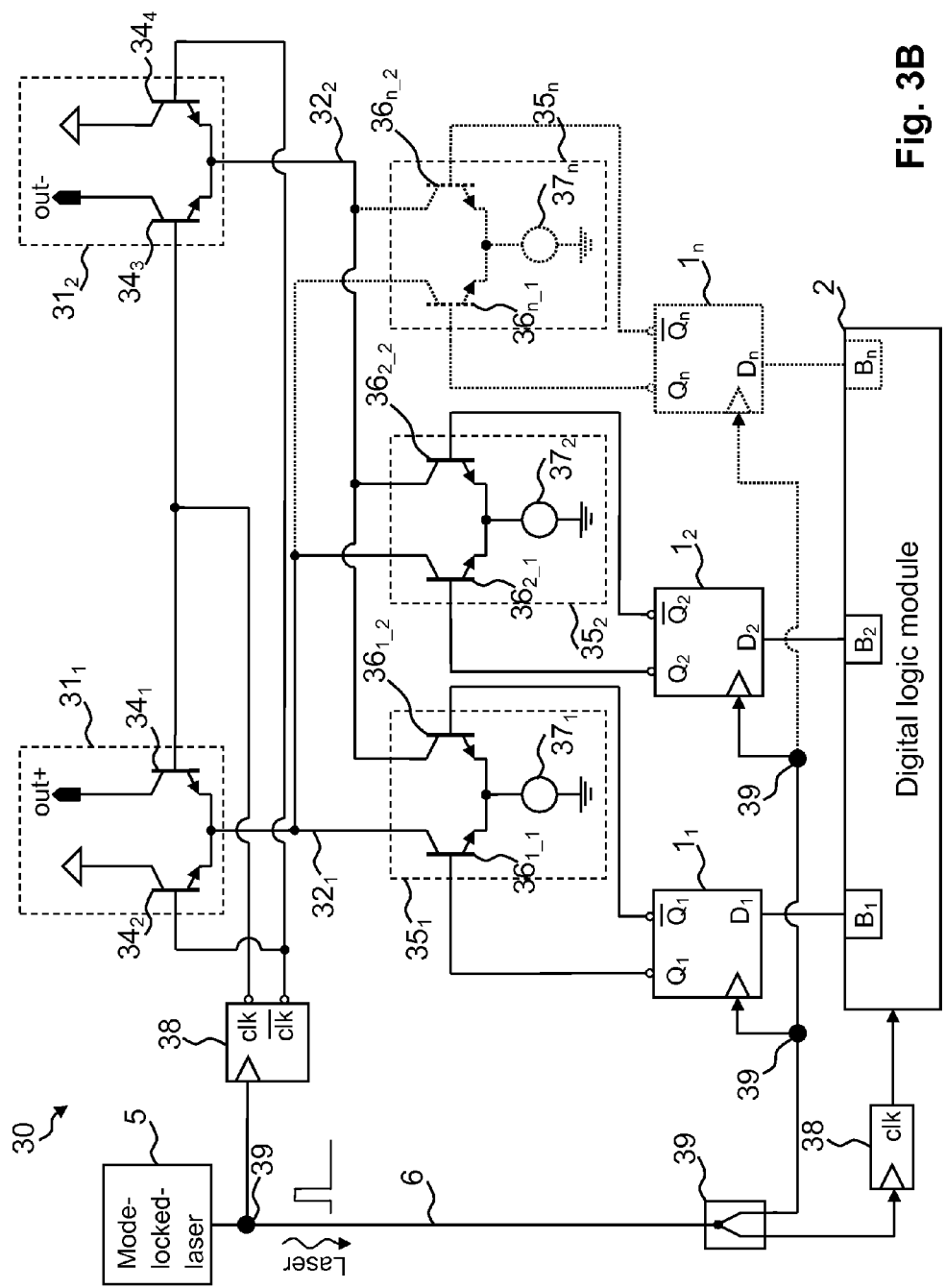
FIG. 3B a further exemplary construction of a digital/analog converter with a particularly high dynamic range which is achieved in an optical manner through the optical clocking of the return-to-zero unit.

FIG. 3B shows a further exemplary construction of a digital/analog converter 30 according to an exemplary embodiment with a particularly high dynamic range which is achieved through the optical clocking of the return-to-zero units $31_2$, $31_2$. The construction of the digital/analog converter 30 according to one embodiment from FIG. 3B corresponds largely to that from FIG. 3A, for which reason only the differences will be explained in the following, and otherwise, reference will be made to the description relating to FIG. 3A. By contrast with FIG. 3A, the base terminals of the second transistors $34_2$, $34_4$ of the first and second return-to-zero units $31_1$, $31_2$ in FIG. 3B are not connected to a constant voltage source, but to a second output of the high-precision clock-pulse generator 38. Accordingly, the clock signal $\overline{clk}$ is present at the base terminals of the second transistors $34_2$, $34_4$ of the first and second return-to-zero units $31_1$, $31_2$, whereas the clock signal clk from the first output of the high-precision clock-pulse generator 38 is present at the base terminals of the first transistors $34_1$, $34_3$ of the first and second return-to-zero units $31_1$, $31_2$. In this context, the clock signal $\overline{clk}$ at the second output of the high-precision clock-pulse generator 38 is preferably phase-displaced by approximately 180° relative to the clock signal clk at the first output of the high-precision clock-pulse generator 38, which is connected to the base terminals of the first transistors $34_1$, $34_3$ of the first and second return-to-zero units $31_1$, $31_2$. The high-precision clock-pulse generator 38 can be constructed according to the exemplary embodiment from FIG. 2, wherein the output $\overline{clk}$ corresponds to the output Q in that context, and the output clk corresponds to the output $\overline{Q}$ in that context. The high-precision clock-pulse generator 38 also comprises a photodiode 20, so that a light pulse of the mode-locked laser 5 can be used for the generation of the clock signal.

As a result of the fact that a clock signal inverted by comparison with the first transistors $34_1$, $34_3$ of the first and second return-to-zero units $31_1$, $31_2$ is present at the base terminals of the second transistors $34_2$, $34_4$ of the first and second return-to-zero units $31_1$, $31_2$, the slew rate (slew rate) is doubled. In this context, it can also be said that the first and second return-to-zero units $31_1$, $31_2$ are controlled in a differential manner by the high-precision clock-pulse generator 38.

The same also applies for the base terminals of the second transistors $36_{1\_2}$, $36_{2\_2}$, $36_{n\_2}$ of the differential units $35_1$, $35_2$ to $35_n$. These are also connected to a second output of the optically clocked flip-flops $1_1$, $1_2$ to $1_n$. The clock signal $\overline{Q}$ of the optically clocked flip-flops $1_1$, $1_2$ to $1_n$ is phase-displaced by 180° by comparison with the clock signal Q of the optically clocked flip-flops $1_1$, $1_2$ to $1_n$, so that the several differential units $35_1$, $35_2$ to $35_n$ are controlled in a differential manner, thereby doubling the slew rate. Optically clocked flip-flops $1_1$, $1_2$ to $1_n$ such as those shown in FIG. 2 can also be used in this context.

Figure 4:
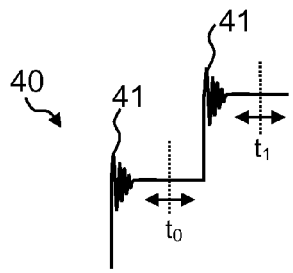
FIG. 4 a current signal generated by the digital/analog converter, of which only a given proportion is output, according to one embodiment.

FIG. 4 shows a current signal generated by the digital/analog converter 30 according to one embodiment on the first and/or second busbar $32_1$, $32_2$, of which only a given portion is output at the two signal outputs. As already explained, the several differential units $35_1$, $35_2$ to $35_n$ are each connected to the first busbar $32_1$ and the second busbar $32_2$. The optically clocked flip-flops $1_1$, $1_2$ to $1_n$ operate in a clock-synchronous manner and ensure that all current sources $37_1$, $37_2$ to $37_n$ are connected to one of the two busbars $32_1$ to $32_2$ at the same time.

FIG. 4 shows a current signal such as can be present, for example, in the first busbar $32_1$ or the second busbar $32_2$. It is clearly evident that a current ripple 41 occurs after the settling process, and the current characteristic provides an overshoot. The overshoot in FIG. 4 has been illustrated in an exaggerated manner by way of explanation.

In FIG. 4, two switching processes are clearly evident, wherein the second switching process additionally increases the current on the busbar $32_1$, $32_2$. Two timing points $t_0$, $t_1$ are also illustrated. The digital/analog converter 30 according to an embodiment preferably outputs the current signal to the outputs at the timing points $t_0$ and $t_1$. The return-to-zero units $31_1$, $32_2$ are controlled by the clock signal, for example, via delay lines, in such a manner that the part of the current signal 40 which contains the overshoot, that is, the current ripple 41, is drained via the second transistor $34_2$, $34_4$ to the corresponding load resistor. After the current signal 40 has settled, the first return-to-zero unit $31_1$ and the second return-to-zero unit $31_2$ connect the current signal 40 through to the output until the next switching process takes place.

The switching times of the transistors $34_1$, $34_2$, $34_3$ and $34_4$ in the first and second return-to-zero unit $31_2$, $31_2$ can be varied dependent upon the settling time of the current signal 40, that is, dependent upon how long the current ripple 41 lasts. This is meaningful if the current ripple 41 lasts longer than one half period. Accordingly, the time duration in every clock pulse in which the first busbar $32_2$ is connected to the first signal output and the second busbar $32_2$ to the second signal output, can be varied. This fact is symbolised in the figures of the drawings by the horizontal arrows. This ensures that a completely or adequately well-smoothed current signal 40 is present at the first signal output and the second signal output. In this context, a very high-precision of the digital/analog converter can also be achieved alongside very high switching frequencies.

Figure 5:
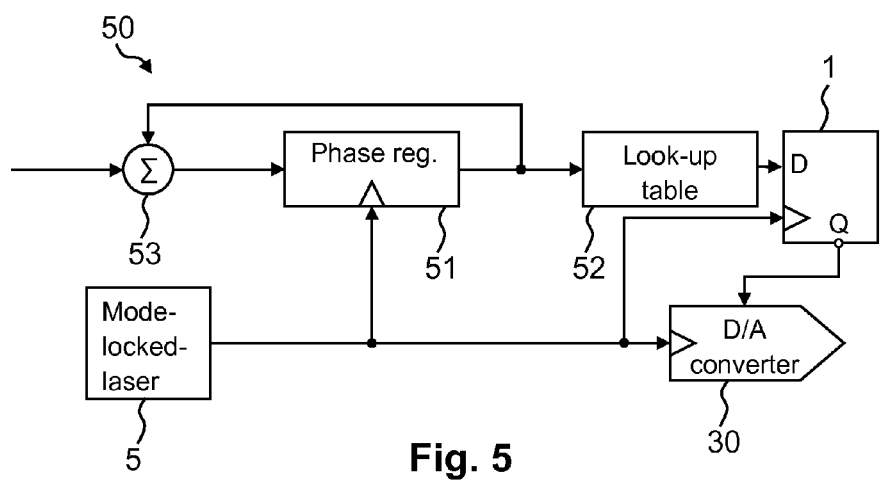
FIG. 5 a unit for direct digital synthesis which contains the digital/analog converter, according to one embodiment.

FIG. 5 shows a unit for direct digital synthesis 50 which contains the digital/analog converter 30 according to an embodiment. With the unit for direct digital synthesis 50, it is possible to generate periodic signals, for example, sinusoidal oscillations. In this context, the bandwidth of the digitally generated signals extends from very low frequencies in the sub-Hertz range, through to the Nyquist frequency of the digital/analog converter 30. Alongside the good frequency precision, which is determined in practice only by the stability of the clock-pulse generator, that is, of the mode-locked laser 5, this method is characterised by relatively low phase noise, very small frequency cuts in the overall frequency range and a rapid continuous-phase tuning over a single, wide frequency range.

The unit for direct digital synthesis 30 provides a phase register 51, a look-up table 52 (look-up table) and the digital/analog converter 30 according to an embodiment, wherein one output of the phase register 51 is fed back to an addition unit 53 at the input of the phase register 51, and wherein the output of the phase register 51 is connected to the look-up table 52, and wherein the look-up table 52 is connected to the digital/analog converter 30 according to an embodiment. A frequency control word is supplied to the addition unit 53 alongside the fed-back phase value at the output of the phase register 51.

The phase register images, for example, a phase position from 0° to 360°, wherein the phase register 51 provides a high-resolution and, for example, 28 bits or 48 bits represent the 360° phase range. The smallest adjustable phase range in this context is $360°/2^{28}$ or $360°/2^{48}$. With every clock pulse, the value at the output of the phase register 51 is incremented. The corresponding analog value for every phase value which the digital/analog converter 30 according to an embodiment must adjust is searched for in a look-up table 52. Accordingly, the corresponding sine value for every phase value is stored in the look-up table 52, wherein, preferably, only one quarter of the sine characteristic is stored at the corresponding resolution, and the remaining regions are calculated by substituting the prefix.

It is particularly advantageous that the phase register 51 is directly or indirectly connected to a further photodiode 20 which converts a pulsed light signal into an electrical clock signal, and that a mode-locked laser 5 feeds both the photodiode 20 of the phase register 51 and also the photodiodes 20 of the digital/analog converter 30. An indirect connection should once again be taken to mean the use of the optical clock-pulse generator which has already been described with reference to FIGS. 2 and 3. The use of such a photodiode either directly within the phase register 51 or in an optical clock-pulse generator which should be arranged as close as possible to the phase register 51 ensures that the electrical clock signal provides the lowest possible phase noise, that is, the minimum possible jitter.

The same also applies for the digital/analog converter 30 according to an embodiment. Through integration of these electrical components together with the optical components on a semiconductor chip 3, especially an ASIC, a unit for direct digital synthesis 50 can be created which provides only a minimal phase noise. In particular, all components, with the exception of the mode-locked laser 5, can preferably be integrated directly on the semiconductor chip 3 in a monolithic manner.

Figure 6:
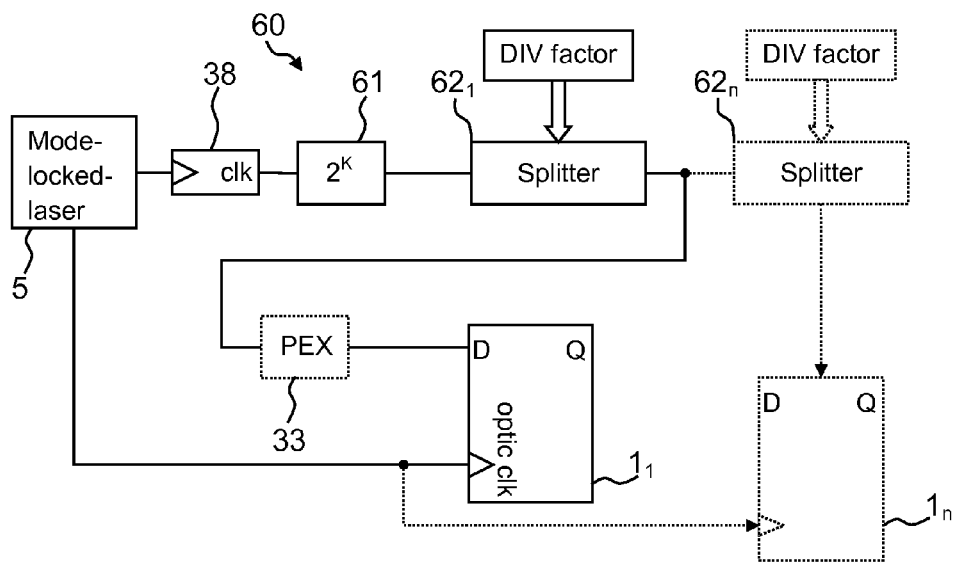
FIG. 6 an overview circuit diagram of a monolithic integration of an optically clocked flip-flop for synchronisation together with a digital splitter unit on a semiconductor chip, especially an ASICs, according to one embodiment.

Finally, FIG. 6 shows a further example of a splitter system 60, for example, in order to convert an optical clock into an electrical clock and to break this down into several steps, so that different regions within the digital logic module 2 can be operated with different clock frequencies. In this context, a mode-locked laser 5 generates an optical clock signal. This clock signal is optionally supplied to a prescaler 61 (prescaler). This prescaler 61 comprises either an integrated photodiode 20 which converts the pulsed light signal into an electrical clock signal, or a high-precision clock-pulse generator 38 is used upstream of this prescaler 61, as shown in FIGS. 2, 3A and 3B. This prescaler serves to break down the clock signal, wherein the factor corresponds to $2^K$, wherein K>1 and K ∈.

The prescaler 61 is further connected to at least one digital splitter unit $62_1$ to $62_n$. The digital splitter unit $62_1$ to $62_n$ further subdivides the already subdivided electrical clock signal into adjustable steps of e.g. 1 to e.g. 1024. By preference, several digital splitter units $62_1$ to $62_n$ which are connected in series are used. In this context, the output with the subdivided input signal is connected to the input of the following digital splitter unit $62_n$. The division factor (division factor) is supplied to the digital splitter units $62_1$ to $62_n$ via an interface, such as an SPI (serial peripheral interface). The clock signal at the output of the digital splitter units $62_1$ to $62_n$ is significantly reduced in this manner by comparison with the pulsed light signal at the output of the mode-locked laser 5.

Optionally, the digital splitter units $62_1$ to $62_n$ can be further connected to a pulse extender 33. The pulse extender 33 in this context connects the output of every digital splitter unit $62_1$ to $62_n$ to the data input D in each case of an optically clocked flip-flop $1_1$ to $1_n$. The pulse extender 33 can increase the duty cycle (duty cycle), as illustrated, for example, in FIG. 6. Following this, the output of the pulse extender 33 is further connected to a data input D of an optically clocked flip-flop $1_1$ to $1_n$. As already explained with reference to FIG. 2, the optically clocked flip-flop $1_1$ to $1_n$ provides an optical clock input which is fed from the mode-locked laser 5 via the optical waveguide 6. A phase noise which has been added to the clock signal within the digital splitter units 61, $62_1$ to $62_n$ or within the pulse extender 33 can be reduced by means of the optically clocked flip-flop $1_1$ to $1_n$ to the level of the phase noise of the mode-locked laser 5.

Furthermore, it is clearly evident that the pulsed light signal which is supplied to the clock input of the optically clocked flip-flops $1_1$ to $1_n$ must be synchronous with the electrical clock signal at the output of the pulse extender 33. A rising or falling edge in the pulsed light signal should not coincide with a rising or falling edge in the electrical clock signal. However, such delay time differences can be compensated by means of optical or electrical delay elements. A calculation of the delay times can be implemented directly by means of software tools which are necessary anyway for the preparation of the ASICs 3.

Otherwise, it would also be conceivable for the mode-locked laser 5 also to be integrated directly in the semiconductor chip 3, especially in the ASICs 3, if this were to be technologically possible.

At the same time, a photodiode 20 can also be integrated in the mode-locked laser 5, so that the mode-locked laser 5 also, at the same time, provides an electrical clock output, wherein the clock signal at the electrical clock output is synchronised with the optical clock signal, that is, the pulsed light signal. By preference, the mode-locked laser 5 in this case also provides a pulse extender 33 which is also integrated within the laser, so that the electrical clock signal at the output provides a duty cycle of 50%. This electrical clock signal which is present at the electrical clock output of the mode-locked laser 5 can be used for the clock supply of the digital logic module 2, wherein, at the same time, the pulsed light signal is converted into an electrical clock signal in the optically clocked flip-flops 1, $1_1$, $1_2$ to $1_n$ directly upstream of the first and/or second return-to-zero unit $31_1$, $31_2$.

The optically clocked flip-flops $1_1$ to $1_n$ preferably do not require additional pulse extenders 33, because their electrical clock signal already provides a duty cycle of 50%. Only in the case that a photodiode 20 is used alone, is a further connected pulse extender 33 required which increases the duty cycle of the electrical clock signal at the output of the photodiode. However, the latter can already be contained in the optically clocked flip-flop $1_1$ to $1_n$ if this is constructed according to the exemplary embodiment from FIG. 2.

Within the scope of the invention, all of the features described and/or claimed and/or illustrated can be combined arbitrarily with one another.

The invention claimed is:

1. A digital/analog converter with a first return-to-zero unit which is connected to a first busbar,
    wherein the first busbar is connected in each case to a first output of several differential units,
    wherein the first return-to-zero unit provides at least one clock input which is directly or indirectly connected to a first photodiode,
    wherein the first photodiode is fed from a pulsed light source, and
    wherein the pulsed light source is a mode-locked laser.

2. The digital/analog converter according to claim 1,
    wherein the digital/analog converter provides a second return-to-zero unit which is connected to a second busbar,
    wherein the second busbar is connected in each case to a second output of the several differential units, and
    wherein the second return-to-zero unit provides at least one clock input which is directly or indirectly connected to the first photodiode.

3. The digital/analog converter according to claim 1,
    wherein each of the several differential units provides at least one data input,
    wherein each data input is connected to a data output, in each case of an optically clocked flip-flop and/or that each of the optically clocked flip-flops provides a data input which is connected to a digital logic module and/or that the first and/or second return-to-zero unit is connected to a clock-pulse generator, and
    wherein the clock-pulse generator contains the first photodiode, so that the first and/or second return-to-zero unit is indirectly connected to the first photodiode.

4. The digital/analog converter according to claim 3,
    wherein each optically clocked flip-flop provides a photodiode at its clock input,
    wherein the photodiode converts a pulsed light signal of the light source into an electrical clock signal and supplies it to the transistors in the optically clocked flip-flop.

5. The digital/analog converter according to claim 4,
    wherein the clock input of every optically clocked flip-flop is fed from the pulsed light source, so that the phase noise at the data input is reduced to the phase noise of the pulsed light source.

6. The digital/analog converter according to claim 3,
    wherein the several differential units feed the first busbar via their first output and the second busbar via their second output and/or that the digital/analog converter is embodied in such a manner that its first and/or its second return-to-zero unit connects the current on the first and/or second busbar through to a first signal output and/or a second signal output as soon as the settling process of the current on the first and/or second busbar is concluded and/or has fallen below a specified threshold value.

7. The digital/analog converter according to claim 3,
    wherein the digital logic module is directly or indirectly connected to at least one photodiode which converts a pulsed light signal from the light source into an electrical clock signal and supplies it to the transistors in the digital logic module and/or that the digital logic module provides a data output for every differential unit and that a phase displacement of the digital output signals relative to one another at the data outputs of the digital logic module is only so large that a synchronisation through the optically clocked flip-flops is possible.

8. The digital/analog converter according to claim 3, wherein the first return-to-zero unit, the second return-to-zero unit, the several differential units each with an optically clocked flip-flop, the digital logic module and the first photodiode, and the further photodiode and the clock-pulse generator are integrated in a monolithic manner on a semiconductor chip and/or that a photodiode and/or a pulse extender is integrated in the mode-locked laser, so that the pulsed light source provides at least one optical clock output and at least one electrical clock output.

9. The digital/analog converter according to claim 8, wherein the first photodiode and/or the further photodiode and/or the photodiodes of the optically clocked flip-flops are connected to a pulse extender, and wherein the pulse extender outputs at its output an electrical pulse which is wider than an electrical pulse which is present at its input, so that the duty cycle is adjustable, and/or that the pulse extender is integrated in the clock-pulse generator.

10. The digital/analog converter according to claim 8, wherein the semiconductor chip is an ASICs and/or that at least a part of an optical wave guide by means of which the first photodiode and/or the further photodiode and/or the optically clocked flip-flops are fed with the pulsed light signal are integrated in the semiconductor chip.

11. The digital/analog converter according to claim 1, wherein the first return-to-zero unit comprises at least one first and one second transistor, wherein the emitter outputs of the two transistors are connected to one another and to the first busbar and/or that a base terminal of the first transistor of the first return-to-zero unit is directly or indirectly connected to the first photodiode, wherein a constant voltage is present at a base terminal of the second transistor of the first return-to-zero unit, or wherein the base terminal of the first transistor of the first return-to-zero unit is connected to a first output of the clock-pulse generator, wherein the base terminal of the second transistor of the first return-to-zero unit is connected to a second output of the clock-pulse generator, wherein the clock signal at the first output is phase-displaced through 180° relative to the clock signal at the second output of the clock-pulse generator, and/or that the second return-to-zero unit comprises at least one first and one second transistor, wherein the emitter outputs of the two transistors are connected to one another and to the second busbar, and/or wherein a base terminal of the first transistor of the second return-to-zero unit is directly or indirectly connected to the first photodiode, wherein a constant voltage is present at a base terminal of the second transistor of the second return-to-zero unit, or wherein the base terminal of the first transistor of the second return-to-zero unit is connected to the first output of the clock-pulse generator, wherein the base terminal of the second transistor of the second return-to-zero unit is connected to the second output of the clock-pulse generator, and wherein the clock signal at the first output is phase-displaced through 180° relative to the clock signal at the second output of the clock-pulse generator.

12. The digital/analog converter according to claim 1, wherein each of the several differential units provides a first and second transistor, wherein, within each differential unit, the emitter of the first transistor and of the second transistor are connected to one another and in each case to a current source and/or that a collector terminal of the first transistor of each of the several differential units is connected to the first busbar and/or that a collector terminal of the second transistor of each of the several differential units is connected to the second busbar and/or that a base terminal of the first transistor of each of the several differential units is connected to a first data output in each case of an optically clocked flip-flop and/or that a constant voltage is present at a base terminal of the second transistor of each of the several differential units, or that a base terminal of the second transistor of each of the several differential units is connected to a second data output in each case of an optically clocked flip-flop.

13. A unit for direct digital synthesis, comprising
a phase register,
a look-up table and
a digital/analog converter,
wherein an output of the phase register is fed back to an addition unit at the input of the phase register,
wherein the output of the phase register is connected to the look-up table,
wherein the look-up table is connected to the digital/analog converter, and
wherein the digital/analog converter is a digital/analog converter according to claim 1.

14. The unit for direct digital synthesis according to claim 13, wherein the phase register is directly or indirectly connected at its clock input to a photodiode, which converts a pulsed light signal of the light source into an electrical clock signal, and that the pulsed light source feeds both the photodiode of the phase register and also the photodiodes of the digital/analog converter and/or that the phase register with its photodiode, the addition unit, the look-up table and the digital/analog converter are integrated in a monolithic manner on a semiconductor chip selected from an ASICs.

15. A splitter system with optical post-synchronisation, comprising
a first and/or at least one further digital splitter unit,
wherein the digital splitter units are connected in series,
wherein the first splitter unit is connected directly or indirectly to a photodiode,
wherein the photodiode is fed from a pulsed light source,
wherein a division factor is supplied to each of the digital splitter units,
wherein each output of the digital splitter units is additionally connected to the data input in each case of one optically clocked flip-flop, and
wherein the clock input of every optically clocked flip-flop is fed from the pulsed light source.

* * * * *